United States Patent
Im et al.

(10) Patent No.: US 7,935,551 B2
(45) Date of Patent: *May 3, 2011

(54) IMAGE SENSOR AND METHOD FOR MANUFACTURING THE SAME

(75) Inventors: Ki Sik Im, Daegu (KR); Woo Seok Hyun, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 384 days.

This patent is subject to a terminal disclaimer.

(21) Appl. No.: 11/998,606

(22) Filed: Nov. 30, 2007

(65) Prior Publication Data

US 2008/0150060 A1     Jun. 26, 2008

(30) Foreign Application Priority Data

Dec. 20, 2006 (KR) .................. 10-2006-0131288

(51) Int. Cl.
*H01L 21/00* (2006.01)
*H01L 31/0232* (2006.01)
*H01L 31/00* (2006.01)
*H01L 27/146* (2006.01)

(52) U.S. Cl. ............... 438/30; 438/7; 438/60; 257/432; 257/440; 257/443; 257/444; 257/83; 257/89; 257/98; 257/E31.127

(58) Field of Classification Search ............... 438/7, 30, 438/48–98; 257/431–466, 79–103, E31.127
See application file for complete search history.

(56) References Cited

U.S. PATENT DOCUMENTS

| | | | | |
|---|---|---|---|---|
| 4,791,396 A | * | 12/1988 | Nishizawa et al. | 257/258 |
| 6,344,369 B1 | * | 2/2002 | Huang et al. | 438/70 |
| 6,632,700 B1 | * | 10/2003 | Fan et al. | 438/70 |
| 2002/0132392 A1 | * | 9/2002 | Nakatani et al. | 438/118 |
| 2004/0198057 A1 | * | 10/2004 | Huang et al. | 438/694 |
| 2004/0219707 A1 | * | 11/2004 | Lee | 438/57 |
| 2004/0251549 A1 | * | 12/2004 | Huang et al. | 257/758 |

(Continued)

FOREIGN PATENT DOCUMENTS

KR     10-2002-0014558 B1     2/2002

OTHER PUBLICATIONS

Hwang Jun; "Method for Forming Complementary-Metal-Oxide-Semiconductor Image Sesnor"; esp@cenet; Abstract of Publication No. KR20020014558 (A); Publication Date: Feb. 25, 2002; esp@cenet database—Worldwide.

*Primary Examiner* — Michael S Lebentritt
*Assistant Examiner* — Karen M Kusumakar
(74) *Attorney, Agent, or Firm* — The Law Offices of Andrew D. Fortney; Andrew D. Fortney; Duangkamol Kay Strohl

(57) ABSTRACT

A method for manufacturing a sensor image may include forming a pixel array including a photodiode structure and an insulating film structure in an active area of a semiconductor substrate; forming a metal pad on the insulating film structure; forming a dielectric and/or etch stop film on the metal pad (and optionally over the pixel array); forming a protective layer on the dielectric and/or etch stop film; and forming a pad opening and a pixel opening by etching the protective layer.

20 Claims, 5 Drawing Sheets

U.S. PATENT DOCUMENTS

2006/0113622 A1* 6/2006 Adkisson et al. ............. 257/443
2006/0126005 A1* 6/2006 Cha ............................... 349/199
2006/0128051 A1* 6/2006 Kim ............................... 438/65
2006/0145175 A1 7/2006 Lee
2006/0292734 A1* 12/2006 Kim ............................... 438/70
2007/0010042 A1* 1/2007 Li .................................. 438/70
2007/0037314 A1* 2/2007 Park ............................... 438/57
2007/0082423 A1* 4/2007 Lee ............................... 438/60

* cited by examiner

IMAGE SENSOR AND METHOD FOR MANUFACTURING THE SAME

The present application claims priority under 35 U.S.C. 119 and 35 U.S.C. 365 to Korean Patent Application No. 10-2006-0131288 (filed on Dec. 20, 2006), which is hereby incorporated by reference in its entirety.

BACKGROUND

1. Field of the Invention

The embodiment relates to an image sensor and a method for manufacturing the same.

2. Description of the Related Art

An image sensor, which is a semiconductor device converting an optical image into electrical signals, may be characterized as a charge coupled device (CCD) image sensor or a Complementary Metal Oxide Silicon (CMOS) image sensor.

The CMOS image sensor includes a photodiode and MOS transistors in a unit pixel to sequentially produce and detect electrical signals in a switching manner, implementing an image. The CMOS image sensor includes transistors and a pixel arrays in which the photodiode is electrically connected to the transistors on a semiconductor substrate. An insulating film structure including one or more wiring layers and a bond pad is formed on the pixel arrays. The pad is mainly formed by a conductive metal connected to an internal wire and is exposed from the insulating film structure in order to electrically connect the pad to an external wire.

A color filter array for detecting different colors and/or implementing a color image of the image sensor is formed on the insulating film structure. And then, a photoresist film is applied on the upper surface of the color filter array and a reflow process is performed, forming a microlens providing light condensed into the pixel array.

However, as the design rule of the image sensor gradually reduces, the size of the unit pixel reduces. Thereby, the light quantity incident on the microlens from outside the image sensor also reduces so that it becomes relatively difficult to sense light in the photodiode. In order sensitivity in the photodiode, the length that the external incident light travels from the microlens to the photodiode should be reduced. Therefore, to reduce the focal length, the height of the wiring and interlayer dielectric layer on the photodiode may be reduced.

SUMMARY OF THE INVENTION

Embodiments of the invention provide a method for manufacturing an image sensor capable of improving sensitivity by reducing focal length.

A method for manufacturing a sensor image according to an exemplary embodiment comprises the steps of forming a pixel array including a photodiode structure and an insulating film structure in an active area of a semiconductor substrate; forming a metal pad on the pixel array; forming an insulating film on the metal pad; forming a protective layer on the insulating film; forming a pad opening and a pixel opening by etching the protective layer; and (optionally) removing the insulating film.

Also, an image sensor according to an exemplary embodiment comprises a pixel array including a photodiode structure and an insulating film structure; a metal pad on or adjacent to the pixel array; a dielectric film on the metal pad; a protective layer on the metal pad and the insulating film; and a pad opening exposing an upper surface of the metal pad and a pixel opening exposing an upper surface of the insulating film structure.

DETAILED DESCRIPTION OF THE EMBODIMENTS

An image sensor and a method for manufacturing the same according to embodiments of the invention will be described with reference to the accompanying drawings.

Figure 7:
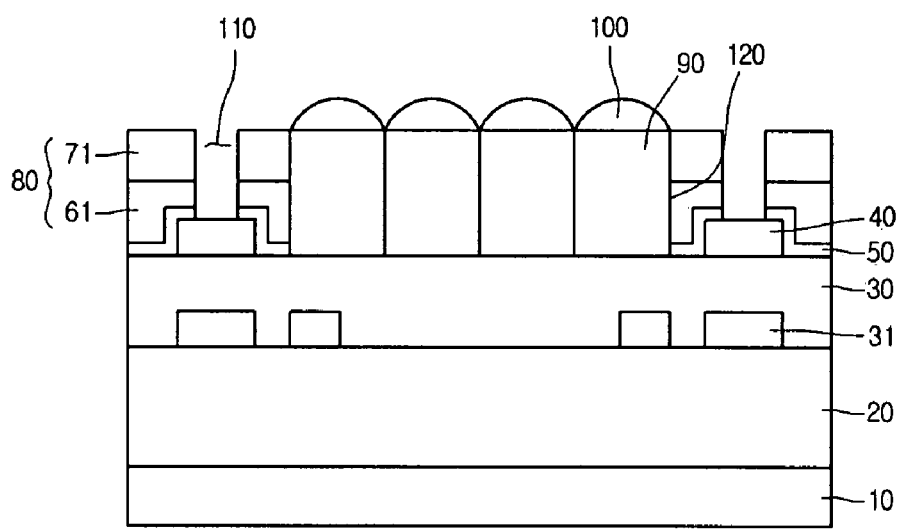

FIG. 7 is a cross-sectional view showing an exemplary image sensor according to embodiments of the invention. In the exemplary image sensor, a pixel array comprising a photodiode structure 20 and an insulating film structure 30 is formed on a semiconductor substrate 10. Herein, the exemplary image sensor has a structure where multiple pixels, each comprising a photodiode and a plurality of MOS transistors, are formed. The array of pixels may comprise an x-by-y array of rows and columns, where x and y are each independently an integer of at least 2, 3, 4, 8, 16, etc. The array may also comprise two or more blocks of pixels, each containing such an array. Typically, each unit pixel contains from 3 to 5 transistors.

Also, the insulating film structure 30 comprises an interlayer dielectric layer for insulation and wiring of the photodiode structure 20 and a metal wiring 31 penetrating the interlayer dielectric layer (e.g., going in and out of the plane of the page). The insulating film structure 30 may comprise an oxide (e.g., silicon dioxide, which may be undoped or doped with fluorine or boron and/or phosphorous), and optionally, with an underlying etch stop layer (e.g., SiN). If the bulk insulating film structure 30 comprises a doped oxide, there may be an undoped silicon dioxide layer (e.g., USG and/or a TEOS-based oxide) above and/or below the doped oxide.

A metal pad 40 is formed on the insulating film structure 30 for an electrical connection with external signal lines. Thus, metal pad 40 may also be known as a bond pad, for forming wire bonds, ball bond, bump bonds, etc. thereto.

A protective layer 80 is formed on or over the insulating film structure 30 and the upper surface of the metal pad 40. The protective layer on the metal pad 40 and the insulating film structure 30 is selectively etched so that a pad opening 110 and a pixel opening 120 are formed. For example, the protective layer 80 may have a stacked structure including a USG film 61 and a nitride film 71.

A color filter array 90 and microlenses 100 are formed on the insulating film structure 30 exposed by the pixel opening 120. Therefore, the distance between the color filter array 90 and/or the microlenses 100, on the one hand, and the photodiode structure 20 on the other hand, is reduced by the step difference between the protective layer 80 and the insulating film structure 30 so that the focal length decreases, making it possible to increase the light quantity incident to the photodiode.

FIGS. 1 to 7 are plan views and cross-sectional views of a method for manufacturing an image sensor according to embodiments of the invention.

Figure 1:
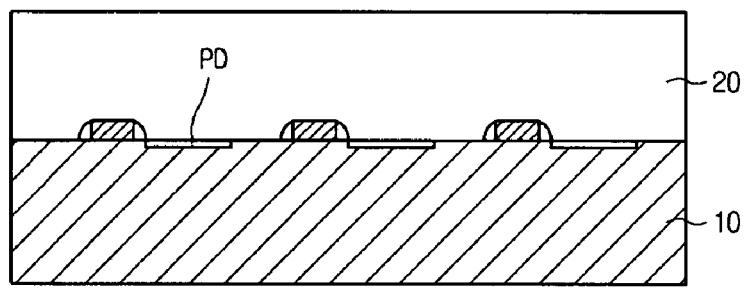
FIG. 1 is a cross-sectional view showing an exemplary photodiode structure.
Figure 2:
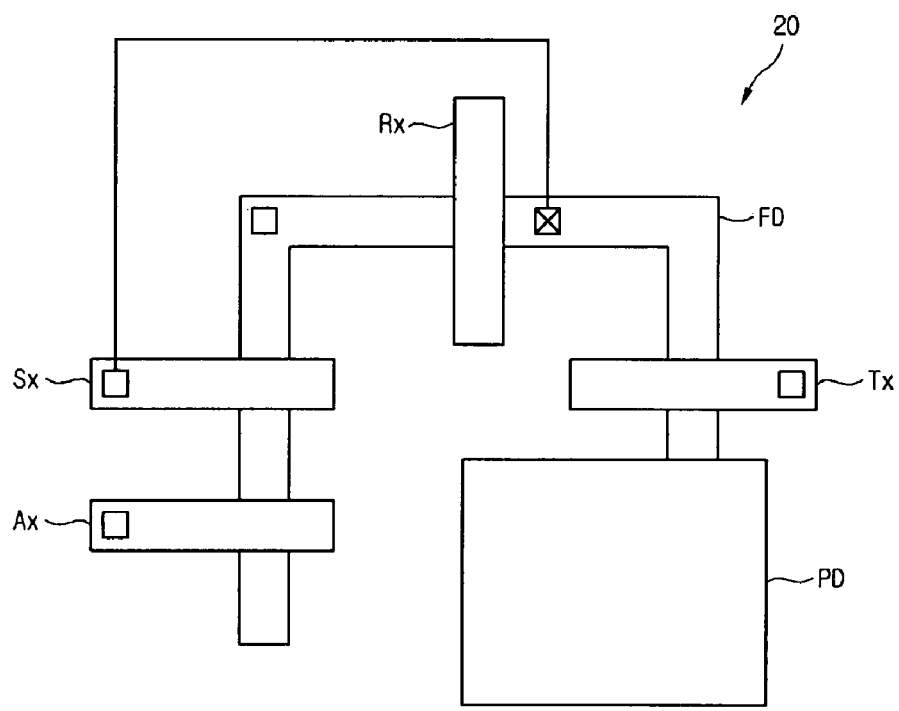
FIG. 2 is a plan view showing one unit pixel in the CMOS image sensor.

FIG. 1 is a cross-sectional view showing a photodiode structure 20 according to an embodiment, and FIG. 2 is a plan view showing a unit pixel included in the exemplary image sensor of FIG. 1.

Figure 3:
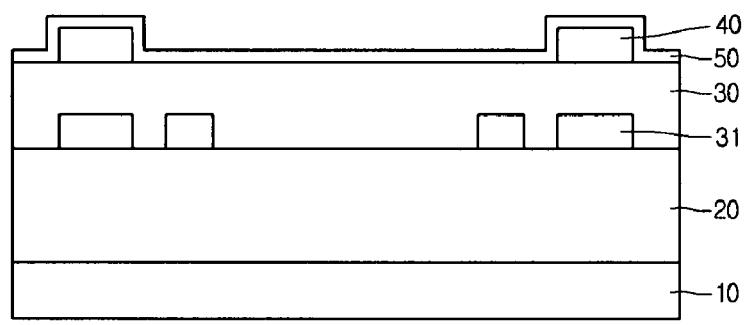
FIGS. 3 to 7 are cross-sectional views showing a method for manufacturing an exemplary image sensor according to embodiments of the invention.

Referring to FIG. 3, a pixel array comprising a plurality of photodiode structures 20 and an insulating film structure 30 is formed in the active area of a semiconductor substrate 10. The photodiode structure 20 comprises a photodiode and a transistor structure such as that as shown in FIGS. 1 and 2, formed on a silicon substrate in a unit pixel. The exemplary unit pixel comprises a photodiode PD, a transfer transistor Tx, a reset transistor Rx, a select transistor Rx, and an access transistor Ax, and converts an optical signal into an electrical signal to output an image (or a part thereof). The photodiode structure 20 has a structure where such a unit pixel is formed in plural.

The insulating film structure 30 is formed on the photodiode structure 20. The insulating film structure 30 is provided with an interlayer dielectric layer for insulation on the semiconductor substrate 10 including the photodiode structure 20, and a lower metal wiring 31 penetrating the interlayer dielectric layer for driving signals in the unit pixel. Although not shown, the insulating film structure 30 can be formed on the photodiode structure 20 in a plurality of layers. For example, the interlayer dielectric layer can be formed in a stacked structure of a FSG film and a TEOS film.

A metal pad 40 connected to the lower metal wiring 31 to be connected to an external driving circuit is formed on the insulating film structure 30. The metal pad 40 is formed by forming a metal layer (not shown) on the insulating film structure 30, forming a photoresist pattern (not shown) defining at least a pad area (and, optionally, additional metal wiring connecting the bond pad 40 to other circuitry in the image sensor) and then etching the metal layer using the photoresist pattern as a mask.

An insulating film 50 having an etching rate that is relatively small under a given set of etch conditions as compared to a material deposited thereon (e.g., providing an etch selectivity ratio of at least 1:10 with regard to an overlying material) is formed on the insulating film structure 30 and the metal pad 40. For example, the insulating film 50 can comprise or be formed of a nitride film (e.g., $Si_3N_4$).

Figure 4:
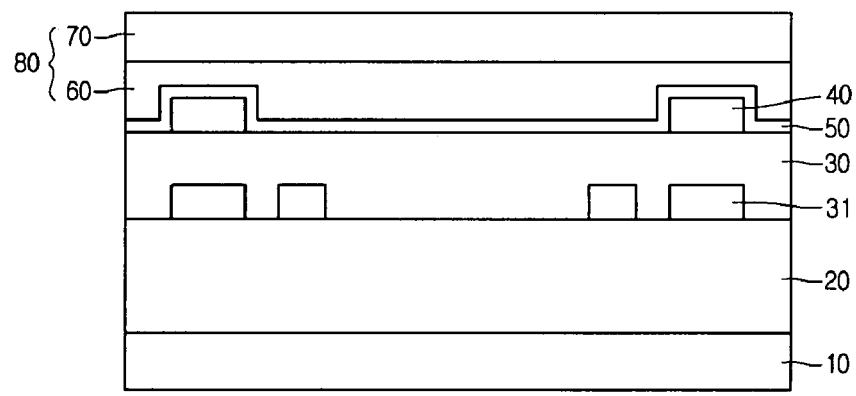

Referring to FIG. 4, protective layers 60 and 70 for protecting a device from external moisture and scratches are formed on the insulating film 50. For example, the protective layers 60 and 70 can comprise or be formed of a USG film or a nitride film, or they can be formed in a stacked structure comprising a USG film 60 and a nitride film 70. In general, the protective layers 60 and 70 are deposited by chemical vapor deposition (CVD) under known conditions. The protective layer 60 can be planarized prior to deposition of the protective layer 70, especially when the protective layer 60 comprises or consists essentially of USG. In one embodiment, the protective layer 80 uses the USG film as a first protective layer 60, and uses the nitride film as a second protective layer 70.

Figure 5:
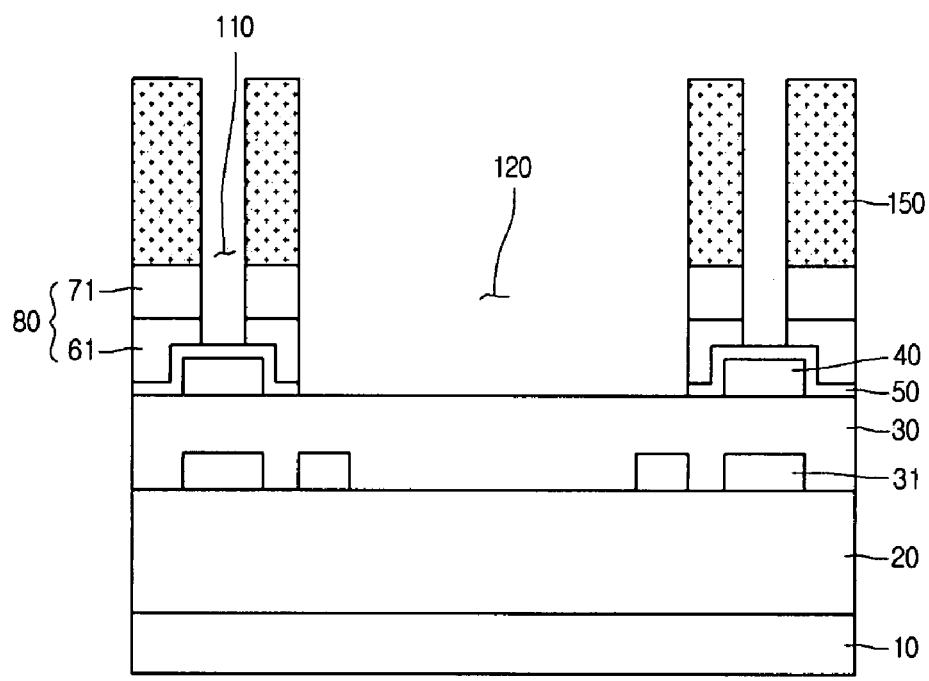
Figure 6:
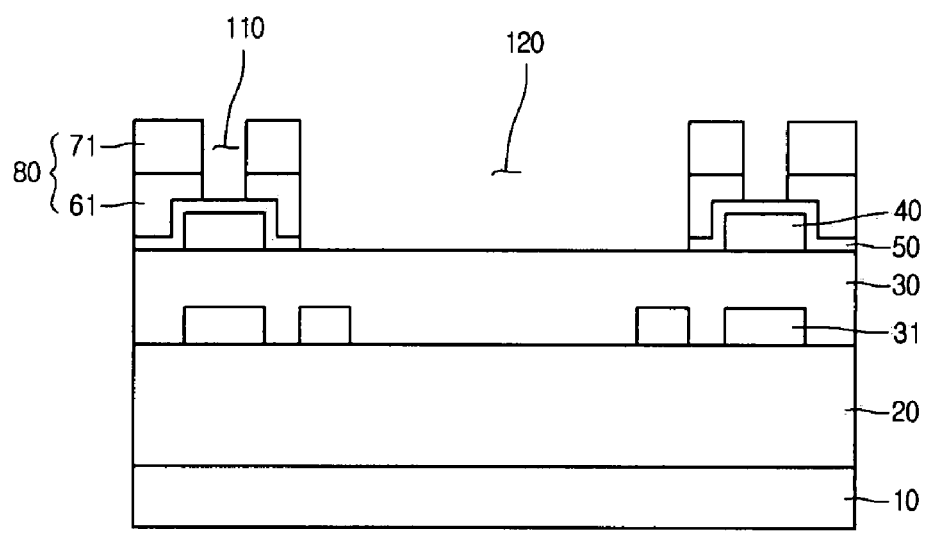

Referring to FIGS. 5 and 6, a photoresist pattern 150 is formed on the first and second protective layers 60 and 70. The photoresist pattern 150, which comprises a pattern adapted to selectively expose the metal pad 40 and the surface of the insulating film structure 30 in a pixel area, is formed by applying a photoresist film on the protective layer 80 and then patterning it. The first protective layer 60 and the second protective layer 70 are etched using the photoresist pattern 150 as an etching mask. Then, a pad opening 110 exposing the upper surface of the metal pad 40, and a pixel opening 120 exposing the surface of the insulating film structure 30 in a pixel area are formed. For example, the first protective layer 60 and the second protective layer 70 can be etched by reactive ion etching.

At this time, since the insulating film 50 on the insulating film structure 30 and the metal pad 40 may comprise a nitride film, it can function as an etch stop layer at the time of etching the first protective layer 60. Therefore, the first and second protective layers 60 and 70 are etched up to the insulating film 50, which in the exemplary embodiment is the etch stop layer, so that the pad opening 110 and the pixel opening 120 can be formed at the same time.

If the insulating film 50 remaining in the pixel opening 120 is selectively removed, the surface of the insulating film structure 30 is selectively exposed in the pixel opening 120. At this time, the nitride film (e.g., insulator 50) in the pad opening 110 is not removed, but remains so that the nitride film (e.g., 50) can be used as an anti-corrosion layer for the metal pad 40 when forming a color filter array 90 in the subsequent process.

A color filter array 90 and a microlens 100 are formed, by the subsequent process, in the pixel opening 120 formed by etching the protective layer 80. In particular, since the focal length between the color array 90 and/or the microlenses 100, on the one hand, and the photodiode structure 20 on the other hand, decreases by an amount equal to about the step difference between the protective layer 80 and the insulating film structure 30, so that the light quantity incident to the photodiode can increase.

Referring to FIG. 7, a color filter array 90 is formed in the pixel opening 120, and microlenses 100 are formed on the color filters of color filter array 90. The color filter array 90 is formed by patterning a photoresist film including (1) one or more pigments and/or dyes and (2) a photosensitive material to correspond to a pixel.

Although not shown, after forming the color filter array 90, a planarization layer can be formed on the color filter array 90. When forming the color filter array 90 results in a step difference between color filters in color filter array 90 (see, e.g., FIG. 9), the planarization layer removes the step difference between color filters.

After the color filter array 90 is formed, microlenses 100 are formed on locations corresponding to the respective color filters. The microlenses 100 condense the external light onto the photodiode of the photodiode structure 20.

After forming the microlenses 100, the insulating film 50 in the pad opening 110 may be removed.

The color filter array 90 and the microlens 100 are formed on the upper surface of the insulating film structure 30, which is the pixel opening 120 formed by etching the protective layer 80, so that their function(s) and/or the focal path are not affected by the potential interference of and/or variations in the protective layer 80, making it possible to improve the efficiency of absorbing the incident light. In other words, when a predetermined area of the protective layer 80 located above the photodiode structure 20 is selectively removed, the refractive index therein becomes smaller and the focal depth becomes shorter than the area where the protective layer 80 remains. Therefore, the color filter array 90 and the microlenses 100 are formed on the surface of the insulating film structure 30 from which the protective layer 80 is removed so that the refractive index decreases, making it possible to improve photosensitivity. Also, the wavelength of the light passing through the microlenses 100 may become relatively larger than that passing through the protective layer 80 to have an effect to shrink the focal length, making it possible to reduce the deterioration due to transmission, absorption, and reflection of light.

Also, the protective layer 80 protects the surface of the metal pad 40 during formation of the microlenses 100, making it possible to prevent the surface of the metal pad 40 from being contaminated.

Figure 8:
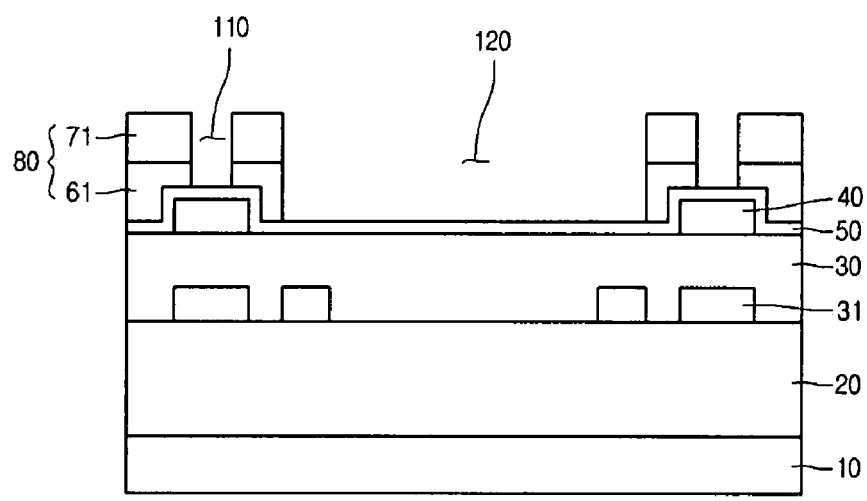
FIGS. 8 to 10 are cross-sectional views showing a method for manufacturing another exemplary image sensor according to alternative embodiments of the invention.
Figure 9:
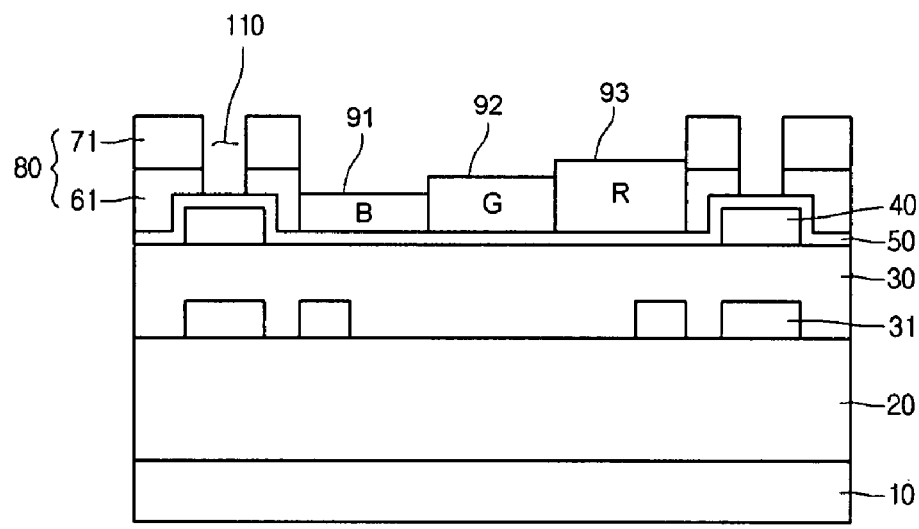
Figure 10:
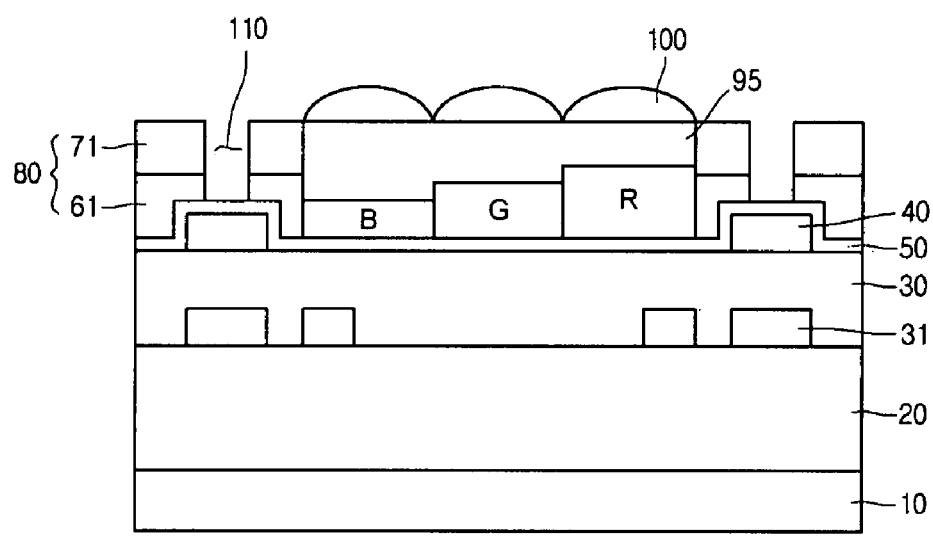

FIGS. 8-10 show alternative embodiments of the present method for manufacturing an image sensor. FIG. 8 shows an image sensor structure similar to the structure of FIG. 6, but with insulating film/etch stop layer 50 intact (i.e., remaining in the pixel area). Thereafter, color filters 91, 92 and 93 of different heights are formed in the pixel area. The color filters may comprise a blue color filter (B), a green color filter (G), and a red color filter (R). Alternatively, the color filters may comprise a yellow color filter, a cyan color filter, and a magenta color filter. Generally, each color filter is separately formed by deposition and photolithographic patterning (e.g., exposure and development). In various embodiments, a first color filter 91 (e.g., the blue color filter) may have a height of from 6000 to 7500 Å (for example, from 6500 to 7200 Å), a second color filter 92 (e.g., the green color filter) may have a height greater than that of the first color filter, in the range of from 6500 to 8000 Å (for example, from 7000 to 7500 Å), and a third color filter 93 (e.g., the red color filter) may have a height greater than that of the second color filter, in the range of from 7000 to 9000 Å (for example, from 7500 to 8500 Å). Generally, the height of the protective layer 80 is greater than that of each of the color filters 91-93.

A planarization layer 95 may then be formed on the color filters 91-93, as shown in FIG. 10. The planarization layer 95 may comprise a resist with an optical transparency (e.g., for all colors of the visible spectrum) of >90%. The planarization layer 95 may be formed by blanket deposition (e.g., spin coating) of a resist and planarizing the resist (e.g., by etch back or polishing, such as mechanical polishing with a fixed abrasive pad or chemical mechanical polishing [CMP] with a slurry). Microlenses 100 are then formed thereon in substantially the same manner as in FIG. 7.

With the image sensor and the method for manufacturing the same according to embodiments of the invention, an etch stop layer (e.g., a nitride film) is formed on the insulating film structure and the metal pad so that the pad opening and the pixel opening are simultaneously formed by etching the protective layer, making it possible to simplify the process.

Also, the color filter and the microlenses are formed on the insulating film structure in the pixel opening, making it possible to shrink the distance between the microlens and the photodiode. Also, the focal length of the photodiode is reduced, making it possible to improve the sensitivity.

Also, the protective layer(s), which may include a USG film and a nitride film, are removed so that the reflection of light due to the difference of the refractive indices between the different materials is suppressed, making it possible to improve the sensitivity of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising the steps of:
    forming a pixel array including a photodiode structure and an insulating film structure in an active area of a semiconductor substrate;
    forming a metal pad on the insulating film structure;
    forming a dielectric film on the metal pad and over the pixel array;
    forming a protective layer on the dielectric film;
    forming a pad opening and a pixel opening by etching the protective layer over the metal pad and over the pixel array;
    selectively removing the dielectric film in the pixel opening such that the dielectric film remains in the pad opening;
    forming a color filter array in the pixel opening, wherein the remaining dielectric film in the pad opening protects the metal pad when forming the color filter array; and
    removing the remaining dielectric film in the pad opening.

2. The method according to claim 1, wherein the dielectric film comprises a nitride film.

3. The method according to claim 1, wherein the pad opening and the pixel opening are simultaneously formed.

4. The method according to claim 3, wherein etching the pad opening and the pixel opening comprises a reactive ion etching process.

5. The method according to claim 3, wherein the dielectric film comprises an etch stop layer.

6. The method according to claim 5, wherein the etch stop layer is formed on both the metal pad and the insulating film structure.

7. The method according to claim 1, wherein the protective layer comprises a USG film and a nitride film.

8. The method according to claim 1, further comprising forming microlenses on the color filter array.

9. An image sensor comprising:
    a pixel array including a photodiode structure and an insulating film structure in an active area of a semiconductor substrate;
    a metal pad on the insulating film structure;
    a dielectric film on the metal pad and the insulating film structure;
    a protective layer on the metal pad and the dielectric film;
    a pad opening in the protective layer exposing the dielectric film on an upper surface of the metal pad and a pixel opening in the protective layer, the pixel opening exposing a surface of the insulating film structure; and
    a color filter array on the exposed surface of the insulating film structure in the pixel opening.

10. The image sensor according to claim 9, wherein the protective layer comprises a USG film and a nitride film.

11. The image sensor according to claim 9, wherein the dielectric film comprises a nitride film.

12. The image sensor according to claim 11, further comprising microlenses on or over the color filter array.

13. The method according to claim 1, wherein color filters in the color filter array are formed at different heights.

14. The image sensor according to claim 9, wherein a first color filter in the color filter array has a first height, a second color filter in the color filter array has a second height different from the first height, and a third color filter in the color filter array has a third height different from the first and second heights.

15. The image sensor according to claim 9, wherein the pad opening and the pixel opening are formed simultaneously.

16. The image sensor according to claim 9, wherein the dielectric film and the protective layer are on peripheral edges of the metal pad.

17. The image sensor according to claim 16, wherein the dielectric film and the protective layer are over peripheral portions of the pixel array.

18. The image sensor according to claim 6, wherein the insulating film structure has a planar upper surface.

19. The image sensor according to claim 9, wherein the dielectric film and the protective layer are over peripheral portions of the pixel array.

20. The method according to claim 1, wherein the insulating film structure has a planar upper surface.

* * * * *